(12) United States Patent
Easter

(10) Patent No.: US 9,350,059 B2
(45) Date of Patent: May 24, 2016

(54) RADIO-FREQUENCY SWITCHES HAVING EXTENDED TERMINATION BANDWIDTH AND RELATED CIRCUITS, MODULES, METHODS, AND SYSTEMS

(71) Applicant: SKYWORKS SOLUTIONS, INC., Woburn, MA (US)

(72) Inventor: Jacob K. Easter, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/826,042

(22) Filed: Aug. 13, 2015

(65) Prior Publication Data

US 2016/0043456 A1 Feb. 11, 2016

Related U.S. Application Data

(63) Continuation of application No. 13/469,652, filed on May 11, 2012, now Pat. No. 9,143,125.

(60) Provisional application No. 61/557,788, filed on Nov. 9, 2011.

(51) Int. Cl.
| | |
|---|---|
| *H01P 1/10* | (2006.01) |
| *H01P 1/15* | (2006.01) |
| *H03H 7/24* | (2006.01) |
| *H04B 1/44* | (2006.01) |

(52) U.S. Cl.
CPC .. *H01P 1/15* (2013.01); *H03H 7/24* (2013.01); *H04B 1/44* (2013.01)

(58) Field of Classification Search
CPC ............... H01P 1/10; H01P 1/15; H03H 7/06
USPC .................. 333/101, 103, 104, 105, 124, 172
See application file for complete search history.

(56) References Cited

U.S. PATENT DOCUMENTS

| | | | |
|---|---|---|---|
| 5,274,343 A | 12/1993 | Russell et al. | |
| 7,595,706 B2 | 9/2009 | Kato et al. | |
| 7,639,100 B2 * | 12/2009 | Fuentes | H01P 1/227 333/103 |
| 7,773,028 B2 | 8/2010 | Chan et al. | |
| 9,143,125 B2 * | 9/2015 | Easter | H01P 1/15 |
| 2013/0113575 A1 | 5/2013 | Easter | |

* cited by examiner

*Primary Examiner* — Dean Takaoka
(74) *Attorney, Agent, or Firm* — Knobbe, Martens, Olson & Bear, LLP

(57) ABSTRACT

Circuits and methods related to a switch having extended termination bandwidth are disclosed. A switch having an input end and an output end, and capable of being in an ON state and an OFF state, can include a termination circuit configured to yield an extended frequency bandwidth in which a desired OFF state termination impedance is provided. A termination circuit may include two or more electrically parallel resistor-capacitor branches coupled to the switch input or output end. A switch termination circuit may provide an OFF state termination impedance that is substantially equal to the switch ON state termination impedance. Also, a termination circuit may enable a desired termination impedance without sacrificing other switch performance features, including insertion loss, isolation, or VSWR difference between ON and OFF states. Also disclosed are examples of how the foregoing features can be implemented in different products and methods of fabrication.

20 Claims, 15 Drawing Sheets

RADIO-FREQUENCY SWITCHES HAVING EXTENDED TERMINATION BANDWIDTH AND RELATED CIRCUITS, MODULES, METHODS, AND SYSTEMS

RELATED APPLICATIONS

This application is a continuation of U.S. patent application Ser. No. 13/469,652, filed May 11, 2012, entitled "RADIO-FREQUENCY SWITCHES HAVING EXTENDED TERMINATION BANDWIDTH AND RELATED CIRCUITS, MODULES, METHODS, AND SYSTEMS," which is a non-provisional of and claims priority to U.S. Provisional Application No. 61/557,788, filed on Nov. 9, 2011, entitled "RF SWITCHES HAVING EXTENDED TERMINATION BANDWIDTH," each of which is hereby incorporated herein by reference in its entirety.

BACKGROUND

1. Field

The present disclosure generally relates to switches, and more particularly to switches having extended termination bandwidth.

2. Description of the Related Art

Absorptive switches are used in some radio-frequency (RF) applications, where it is desirable to have switches that have a selected impedance presented to the switch's input and/or output when the switch is in its OFF state. Such an OFF-state impedance may or may not be substantially the same as that of the switch's ON state. For the purpose of description herein, it will be assumed that when a switch is in its ON state, RF signal is allowed to pass between the switch's input and output. Meanwhile, when in its OFF state, RF signal is not allowed to pass between the input and the output.

For RF switches intended to be used over relatively large bandwidths, achieving well-controlled termination impedance across a specified frequency range can be challenging. Such a challenge can be due to, for example, on-chip DC blocking capacitors typically used in the switch termination leg resonating with inductance provided by a chip bond wire. Such bond wires and/or capacitors can be configured for specific operating frequencies, but the associated bandwidth is often not sufficient to provide desirable termination impedance across all of the specific operating frequencies. In some situations, parasitic capacitances of switch devices can also be a factor in the termination impedance, particularly at high frequencies. The effects of the parasitics can be managed by, for example, resizing the devices. However, such a measure can lead to degradation in other performance metrics such as insertion loss and isolation.

SUMMARY

In some implementations, the present disclosure relates to a switching circuit that includes an input port configured to receive a radio-frequency (RF) signal. The switching circuit further includes an output port configured to output the RF signal. The switching circuit further includes a switch configured to be capable of being in first and second states, with the first state corresponding to the input and output ports being electrically connected so as to allow passage of the RF signal therebetween, and the second state corresponding to the input and output ports being electrically isolated. The switching circuit further includes at least one termination circuit configured so as to provide termination for at least one of the input and output ports. The termination circuit includes an assembly of two or more electrically parallel branches, with each branch having a resistor and a capacitor connected in series so as to yield a desired impedance for the termination circuit when encountered by an RF signal, having a frequency within a selected frequency range, arriving at the respective port when the switch is in the second state.

In some embodiments, values of the capacitors of the two or more branches can be selected such that the termination circuit's effective capacitance resonates with an inductance associated with the termination circuit within at least a portion of the selected frequency range. Such a selected frequency range can include a range of about 0.500 GHz to 4 GHz, about 2.5 GHz to 6 GHz. Other ranges are also possible.

In some embodiments, values of the capacitors of the two or more branches can be selected to yield a desired capacitance that facilitates the desired impedance. In some embodiments, values of the resistors of the two or more branches can be selected so as to yield a desired resistance that facilitates the desired impedance. Such a desired impedance can include a value of about 50 ohm. Other values are also possible.

In accordance with some implementations, the present disclosure relates to a radio-frequency (RF) switch that includes a switching circuit having an input and an output, the switching circuit configured to be capable of being in ON and OFF states. The RF switch further includes a shunt circuit coupled to the switching circuit and configured to shunt RF signals to a signal ground when the switching circuit is in the OFF state. The shunt circuit includes at least one termination circuit configured to provide a desired termination impedance for the RF switch when the switching circuit is in the OFF state. The termination circuit includes an assembly of two or more electrically parallel resistor-capacitor (RC) branches.

In some embodiments, at least one termination circuit can be further configured to provide a desired termination impedance for the RF switch when the switching circuit is in the ON state. In some embodiments, the desired termination impedance corresponding to the ON state of the switching circuit can be substantially the same as the desired termination impedance corresponding to the OFF state of the switching circuit for a selected range of operating frequency. The desired termination impedance corresponding to the ON state of the switching circuit may be within a selected tolerance of the desired termination impedance corresponding to the OFF state of the switching circuit for a selected range of operating frequency. The selected tolerance may be optionally about 1 ohm. In some embodiments, the at least one termination circuit can be further configured to provide insignificant impact to a difference between a switching circuit ON state voltage standing wave ratio and a switching circuit OFF state voltage standing wave ratio, a switching circuit OFF state isolation performance or a switching circuit ON state insertion loss performance. In some embodiments, the desired termination impedance of the RF switch can be at either or both of the input and output of the RF switching circuit.

As taught in a number of implementations, the present disclosure relates to a semiconductor die having an integrated circuit (IC). The die includes a substrate configured to receive a plurality of components and a switching circuit disposed on the substrate, the switching circuit having an input and an output, and configured to be capable of being in ON and OFF states. The die further includes at least one bandwidth-extension circuit coupled to at least one of the input and output of the switching circuit and configured to provide a desired termination impedance for the switching circuit when the switching circuit is in the OFF state. The bandwidth-extension circuit includes an assembly of two or more electrically parallel resistor-capacitor (RC) branches and configured to be capable of being electrically connected to a signal ground.

In some embodiments, the die can further include a transceiver circuit electrically connected to the switching circuit and configured to process RF signals. In some embodiments, the die can further include a local oscillator (LO) circuit coupled to the transceiver circuit via the switching circuit so as to facilitate operation of the transceiver circuit. In some embodiments, the die can further include a power amplifier (PA) circuit coupled to the transceiver circuit and configured to amplify RF signals received from or provided to the transceiver circuit.

According to a number of implementations, the present disclosure relates to a packaged module for a radio-frequency (RF) device. The module includes a packaging substrate configured to receive a plurality of components and an integrated circuit (IC) formed on a semiconductor die and mounted on the packaging substrate. The IC includes a switching circuit having an input and an output and configured to be capable of being in ON and OFF states. The IC further includes at least one bandwidth-extension circuit coupled to at least one of the input and output of the switching circuit and configured to provide a desired termination impedance for the switching circuit when the switching circuit is in the OFF state. The bandwidth-extension circuit includes an assembly of two or more electrically parallel resistor-capacitor (RC) branches. The module further includes a conductive path such as a bond wire and/or a conductive trace configured to connect each of the at least one bandwidth-extension circuit to a signal ground. The conductive path is dimensioned to provide a desired inductance for the bandwidth-extension circuit.

In some embodiments, the packaged module may further include at least one connection configured to facilitate passage of signals to and from the semiconductor die. In some embodiments, the packaged module may include a packaging structure to provide protection for the semiconductor die.

In some implementations, the present disclosure relates to a wireless device having an antenna and a transceiver coupled to the antenna and configured to process radio-frequency (RF) signals. The wireless device further includes an RF switch coupled to the transceiver and configured to be capable of being in ON and OFF states. The RF switch includes at least one bandwidth-extension circuit configured to provide a desired termination impedance for the RF switch when in the OFF state. The bandwidth-extension circuit includes an assembly of two or more electrically parallel resistor-capacitor (RC) branches and connected to a signal ground by a conductor having a desired inductance. In some embodiments, such an RF switch can include an absorptive RF switch. In some embodiments, the wireless device may include a receptacle configured to receive a battery and to provide electrical connection between the battery and the RF switch.

In accordance with a number of implementations, the present disclosure relates to a method for fabricating a radio-frequency (RF) switch. The method includes providing a substrate, and forming an array of switches connected in series so as to define an input and an output. The method further includes forming a shunt path for at least one of the input and output of the array of switches. The method further includes forming two or more electrically parallel RC branches along the shunt path so as to provide desired termination impedance.

In some embodiments, the substrate can include a semiconductor substrate. In some embodiments, the array of switches can include an array of field effect transistors (FETs). The array of FETs may include one or more FETs.

DETAILED DESCRIPTION OF SOME EMBODIMENTS

Figure 1A:
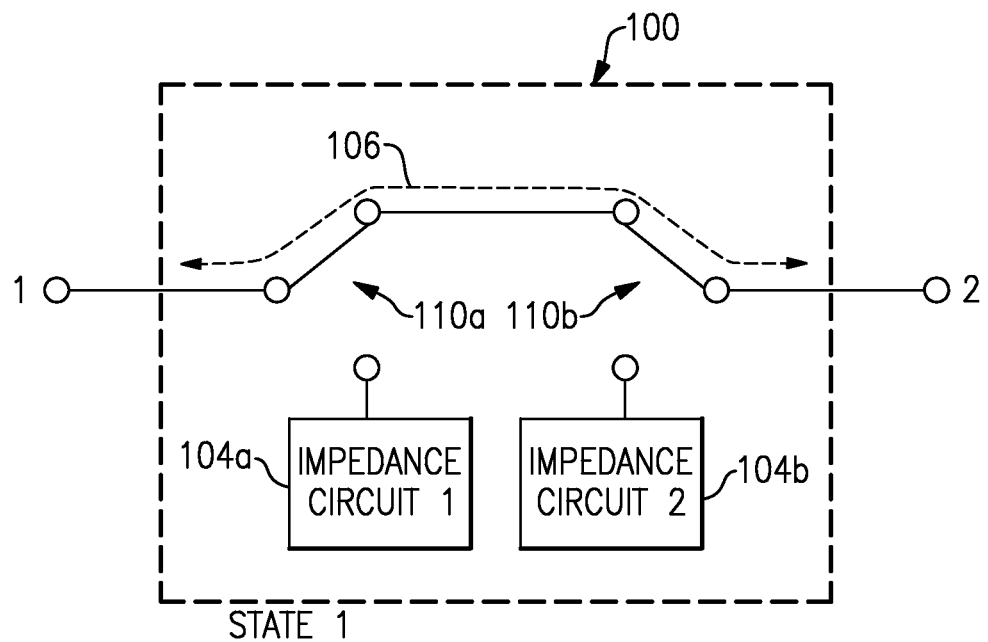
FIG. 1A schematically depicts a switching device configured to pass signals such as radio-frequency (RF) signals between first and second ports when in a first state.

The headings provided herein, if any, are for convenience only and do not necessarily affect the scope or meaning of the claimed invention.

In some radio-frequency (RF) applications, it is desirable to have switches that have a selected impedance presented to the switch's input and/or output when the switch is in its OFF state. Absorptive switches are typically used in such applications, and various features that can be implemented in such absorptive switches are described herein. It will be understood, however, that one or more features described herein can also be implemented in other types of switches. Further, it will be understood that one or more features described herein can also be implemented in other impedance termination applications other than those associated with switches.

In the context of an absorptive switch, it is desirable to have a selected impedance be presented to the switch's input and/or output when the switch is in its OFF state. Such an OFF-state impedance may or may not be substantially the same as that of the switch's ON state. For the purpose of description herein, it will be assumed that when a switch is in its ON state, RF signal is allowed to pass between the switch's input and output; and when in its OFF state, RF signal is not allowed to pass between the input and the output.

In some RF applications, a value of termination impedance at a switch's input and/or output can be important in meeting some system specifications. For example, it is desirable to have a local oscillator (LO) switch in some GSM transceivers to provide minimal perturbation to the output signal phase while switching in order to satisfy peak phase error requirements. An absorptive switch with poorly controlled termination impedance can cause significant load-pulling on the LO PLL/VCO (phase-locked loop/voltage-controlled oscillator) during switching operations, which in turn can result in relatively high peak phase error.

For RF switches intended to be used over relatively large bandwidths, achieving well-controlled termination impedance across a specified frequency range can be challenging. Such a challenge can be due to, for example, on-chip DC blocking capacitors typically used in the switch termination leg resonating with inductance provided by a chip bond wire. Such bond wires and/or capacitors can be configured for specific operating frequencies, but the associated bandwidth is often not sufficient to provide desirable termination impedance across all of the specific operating frequencies.

In some situations, parasitic capacitances of switch devices can also be a factor in the termination impedance, particularly at high frequencies. The effects of the parasitics can be managed by, for example, resizing the devices. However, such a measure can lead to degradation in other performance metrics such as insertion loss and isolation.

Described herein are circuits, devices and methods for providing a desired termination impedance for a relatively wide range of frequencies. In some implementations, such an extended bandwidth can be achieved without significant degradation of other desirable performance parameters.

FIG. 1A schematically depicts a switching device 100 configured to pass signals such as radio-frequency (RF) signals between first and second ports (1 and 2) when in a first state (e.g., ON state). Such passage of RF signal is depicted by a path 106 between the first and second ports. The switching device 100 can be unidirectional (first port to second port, or second port to first port) and/or bidirectional. To achieve such an ON state, switches 110a and 110b can be in the indicated configurations. Accordingly, impedance circuits 104a and 104b are disconnected from the first and second ports.

Figure 1B:
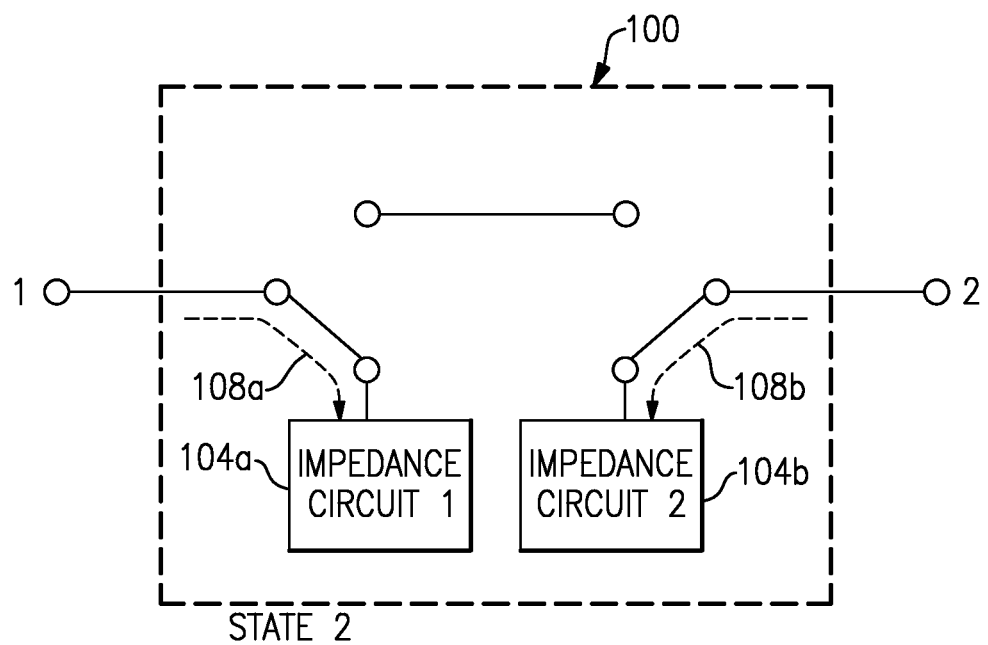
FIG. 1B shows that the switching device of FIG. 1A can include one or more impedance circuits configured to provide desired termination when the switching device is in a second state.

FIG. 1B shows that the switching device 100 can be configured to be in a second state (e.g., OFF state) so that one or more of the impedance circuits 104a, 104b provide desired termination impedance to the first and/or second ports. For example, signal path 108a depicts termination of RF signal present at the first port by the first impedance circuit 104a. Similarly, signal path 108b depicts termination of RF signal present at the second port by the second impedance circuit 104b. Various examples of the impedance circuits 104a, 104b are described herein in greater detail.

In the description herein, both of the first and second ports (e.g., input and output ports) are provided with impedance circuits. It will be understood, however, that having both impedance circuits is not a requirement. For example, if it is desired to provide selected-impedance termination for only one side (e.g., input or output), then a switching device can be configured to have one on the selected-impedance terminated side.

Figure 2:
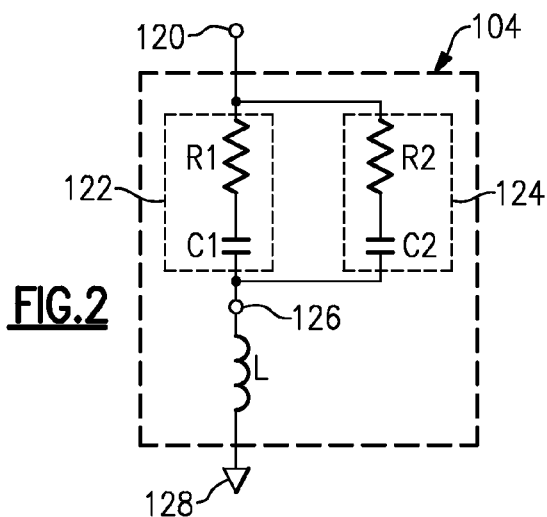
FIG. 2 shows an example of a termination impedance circuit that can be implemented in the device of FIGS. 1A and 1B.

FIG. 2 shows an example of a termination impedance circuit 104 that can be implemented in the device of FIGS. 1A and 1B. The circuit 104 can include a first RC branch 122 having a resistor with resistance R1 connected in series with a capacitor with capacitance C1. The first RC branch 122 is shown to couple a termination input node 120 with an inductor having inductance L via a node 126. The inductor is then coupled to a signal ground 128.

In some implementations, the termination impedance circuit 104 can include one or more additional RC branches. In the example shown in FIG. 2, a second RC branch 124 can be electrically connected in parallel to the first RC branch 122 between the nodes 120 and 126. The second RC branch 124 is shown to have a resistor with resistance R2 connected in series with a capacitor with capacitance C2. As described herein, values of R1, C1, R2, C2 and L can be selected to yield a desired termination impedance over a wider range of frequency than a range of frequency provided if the circuit 104 only had one RC branch.

Figure 3A:
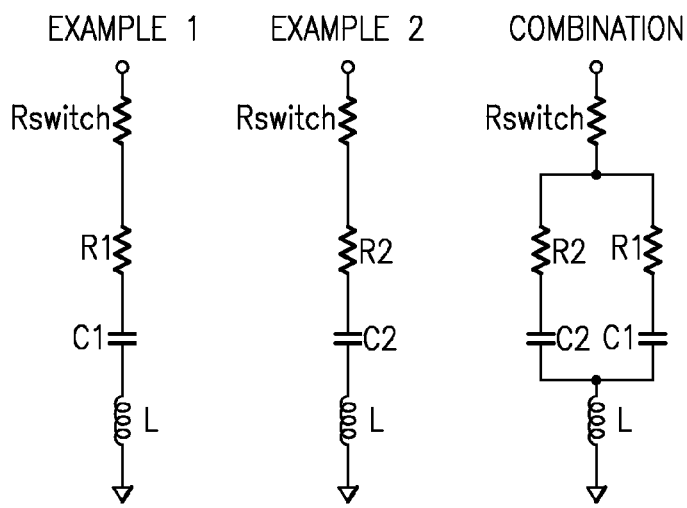
FIGS. 3A and 3B show an example of how the circuit of FIG. 2 can be configured to provide an extended range of frequency having desired termination impedance.
Figure 3B:
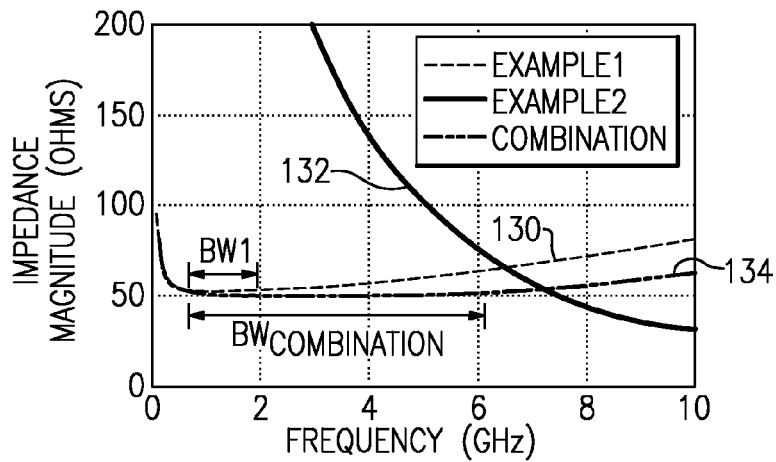

FIGS. 3A and 3B show an example of how the circuit of FIG. 2 can be configured to provide such an extended range of frequency in which the circuit provides a desired termination impedance. "Example 1" is shown to include a switch resistor (Rswitch) connected to an input node and a first RC branch having R1 and C1. The first RC branch is further connected in series with inductance L which in turn is connected to a signal ground. Similarly, "Example 2" is shown to include a switch resistor (Rswitch) connected to an input node and a second RC branch having R2 and C2. The second RC branch is further connected in series with inductance L which in turn is connected to a signal ground. "Combination" is shown to include a switch resistor (Rswitch) connected to an input node and a parallel combination of the first and second RC branches. The parallel combination of the first and second RC branches is further connected in series with inductance L which in turn is connected to a signal ground. Table 1 shows example values of the Rswitch, R1, C1, R2, C2 and L depicted in FIG. 3A:

TABLE 1

| Circuit element | Approximate value |
| --- | --- |
| Rswitch | 12 ohm |
| R1 | 40 ohm |
| C1 | 20 pF |
| R2 | 20 ohm |
| C2 | 0.25 pF |
| L | 1 nH |

In FIG. 3B, impedance magnitudes of the "Example 1," "Example 2," and "Combination" circuits are shown as functions of frequency as curves 130, 132, and 134, respectively. If the desired impedance is approximately 50 ohms, then the "Example 1" circuit is shown to have a desired termination impedance bandwidth ("BW1") of about 1.7 GHz to 2 GHz. By combining the second RC branch with the first RC branch, the "Combination" circuit is shown to have a substantially larger bandwidth ("$BW_{Combination}$") of about 1.7 GHz to 6 GHz.

In the examples shown in FIGS. 3A and 3B, an addition of the second RC branch to the first RC branch extends the bandwidth BW1 associated with the first RC branch to the bandwidth $BW_{Combination}$ while the values of R1 and R2 remain the same. It will be understood that the first RC branch remaining the same is not a requirement. In some implementations, it can be preferable to select RC values of a plurality of branches together so as to yield a desired termination impedance performance.

Figure 4A:
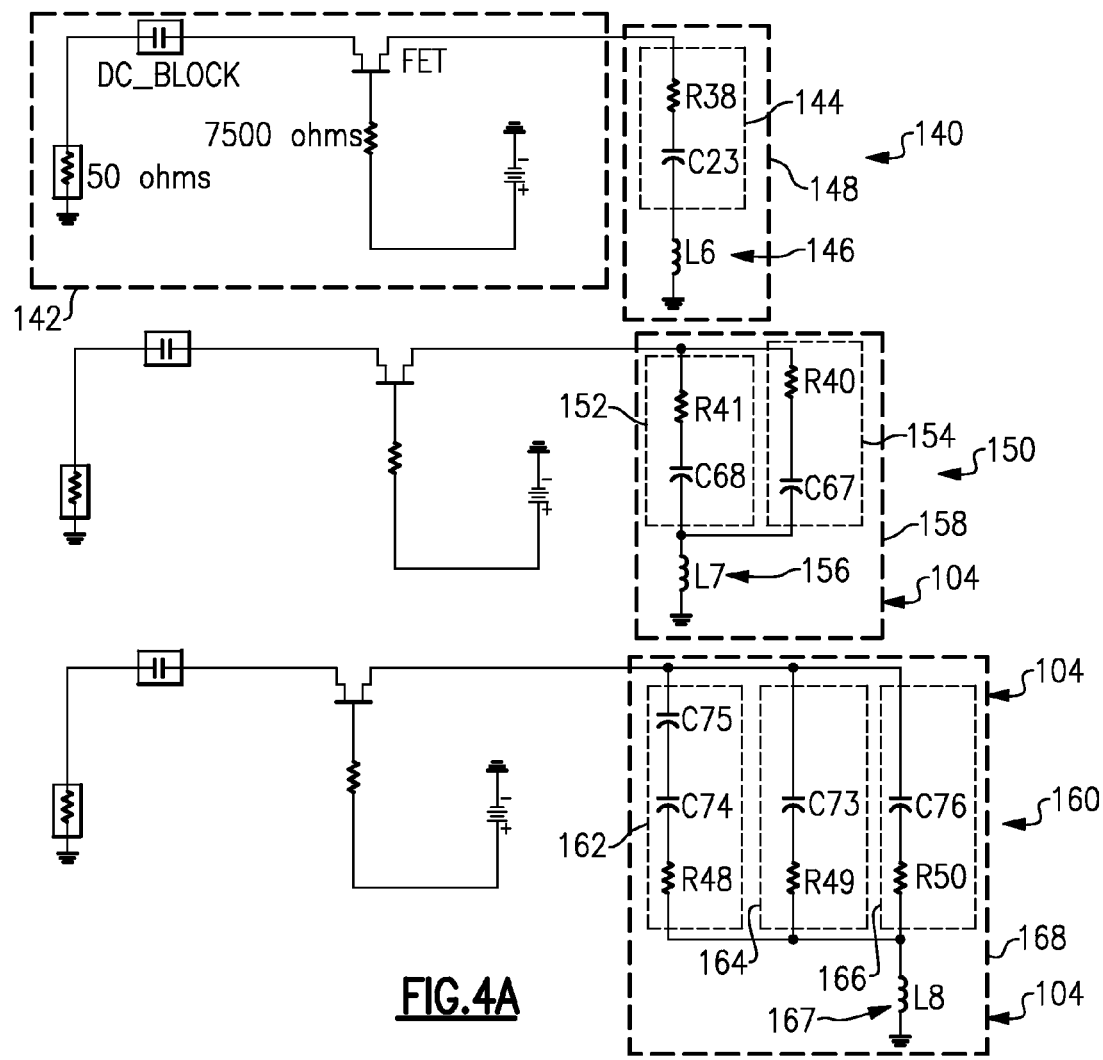
FIGS. 4A and 4B show another example of how the circuit of FIG. 2 can be configured to provide an extended range of frequency having desired termination impedance.
Figure 4B:
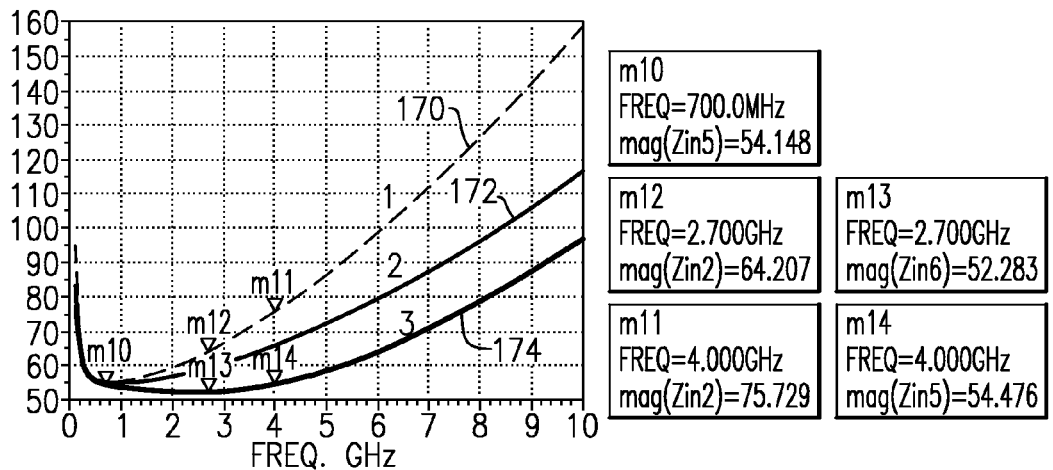

FIGS. 4A and 4B show another example of how the circuit of FIG. 2 can be configured to provide an extended range of frequency having desired termination impedance. In FIG. 4A, a circuit 142 is shown to be terminated by a termination circuit 148 having one RC branch 144 (configuration 140), by a termination circuit 158 having two RC branches 152, 154 (configuration 150), and by a termination circuit 168 having three RC branches 162, 164, 166 (configuration 160). In each of the three example configurations 140, 150, 160, the RC branch(es) is/are coupled to a ground via an inductor (146, 156, 167). Values associated with the various resistors, capacitors, and inductors are listed in Tables 2A-2C:

TABLE 2A

Termination circuit 148

| Circuit element | Approximate value |
|---|---|
| R38 | 38 ohm |
| C23 | 20 pF |
| L6 | 1 nH |

TABLE 2B

Termination circuit 158

| Circuit element | Approximate value |
|---|---|
| R41 | 75 ohm |
| C68 | 20 pF |
| R40 | 75 ohm |
| C67 | 8 pF |
| L7 | 1 nH |

TABLE 2C

Termination circuit 168

| Circuit element | Approximate value |
|---|---|
| C75 | 1 pF |
| C74 | 1 pF |
| R48 | 75 ohm |
| C73 | 8 pF |
| R49 | 95 ohm |
| C76 | 20 pF |
| R50 | 65 ohm |
| L8 | 1 nH |

In FIG. 4B, impedance magnitude curves 170, 172 and 174 as functions of frequency correspond to the example termination circuits 148 (one RC branch), 158 (two RC branches) and 168 (three RC branches), respectively. As shown, the example two-branch termination circuit (curve 172) has a better range of frequency close to 50 ohms than the example one-branch termination circuit (curve 170); and the example three-branch termination circuit (curve 174) has a better range of frequency close to 50 ohms than the example two-branch termination circuit (curve 172).

In the examples shown in FIGS. 4A and 4B, the three-branch case yields a better performing configuration than the two-branch case. It will be understood increasing the number of RC branches does not necessarily improve the bandwidth performance. In some implementations, a two-branch configuration can provide better performance than a three-branch configuration. More generally, increasing the number of RC branches can increase bandwidth performance in some embodiments. In other embodiments, a configuration having a plurality of RC branches can be configured to provide better bandwidth performance than another configuration having a greater number of RC branches.

Figure 5A:
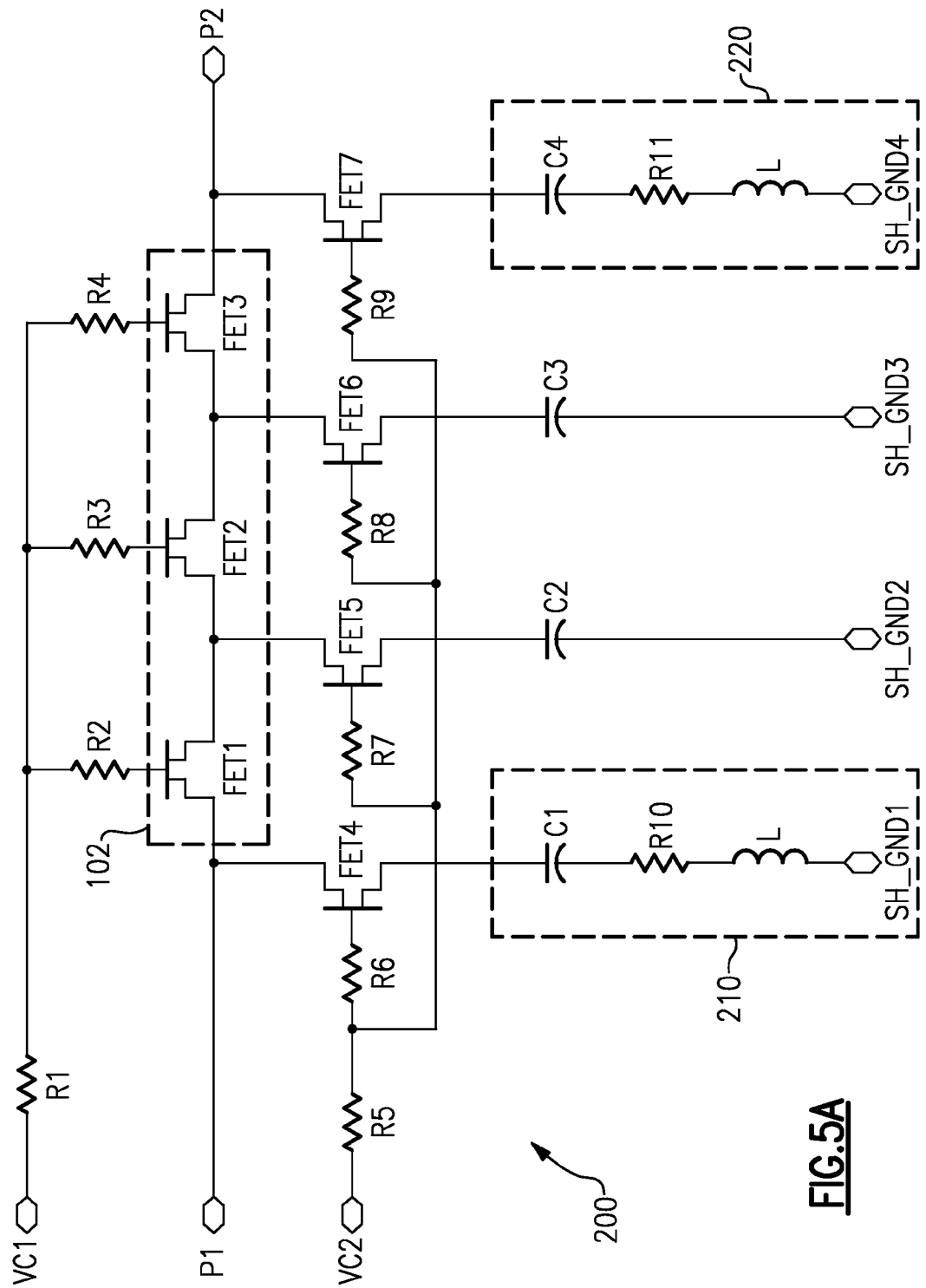
FIG. 5A shows an example of an absorptive RF switch having impedance termination circuits that do not have frequency bandwidth extension functionality.
Figure 5B:
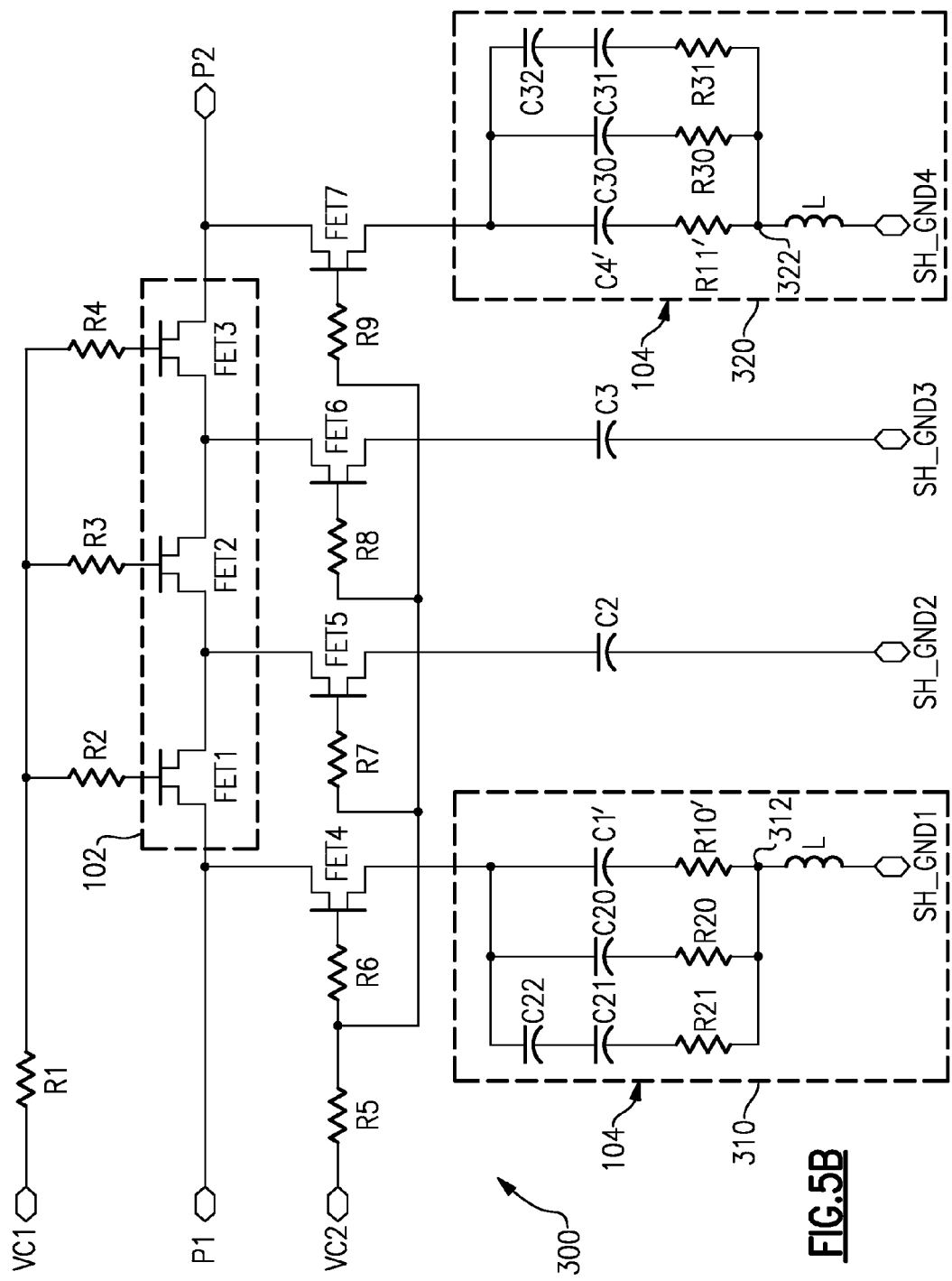
FIG. 5B shows an example where an absorptive RF switch similar to that of FIG. 5A can be configured to provide the frequency bandwidth extension functionality.

FIG. 5A shows an example of an absorptive RF switch 200 having impedance termination circuits 210, 220, with each having a single RC branch. FIG. 5B shows an example of an absorptive RF switch 300 similar to that of FIG. 5A, but with impedance termination circuits 310, 320, each having more than one RC branch. As described herein, the termination circuits 310, 320 of FIG. 5B can be configured to yield an extension of frequency bandwidth in which desired impedance is provided when the RF switch 300 is in its OFF state.

The ON and OFF states of the example RF switches 200 and 300 can be achieved as follows. An input port "P1" can be configured to receive an RF signal, and an output port "P2" can be configured to output the RF signal when a switch 102 is in a conducting mode. The switch 102 can include one or more FETs, with each being turned on or off based on control voltage provided through port "VC1," R1, and its respective resistor (R2, R3 or R4). In the example shown, the FETs (FET1, FET2, FET3) in the switch 102 are turned on or off together.

As further shown in FIGS. 5A and 5B, switchable shunt paths can be provided and configured so that when the FETs (FET1, FET2, FET3) of the switch 102 are all turned on (ON state of the switches 200 and 300), each of shunt FETs (FET4, FET5, FET6, FET7) is turned off (via control voltage through port "VC2," R5, and its respective resistor (R6, R7, R8 or R9). When the FETs (FET1, FET2, FET3) of the switch 102 are all turned off (OFF state of the switches 200 and 300), each of shunt FETs (FET4, FET5, FET6, FET7) is turned on. In such a state, an RF signal at the input port P1 generally sees an impedance provided by the circuit 210 (for the example switch 200 of FIG. 5A) and the circuit 310 (for the example switch 300 of FIG. 5B). On the output side, an RF signal at the output port P2 generally sees an impedance provided by the circuit 220 (for the example switch 200 of FIG. 5A) and the circuit 320 (for the example switch 300 of FIG. 5B). The intermediate shunt paths to SH_GND2 and SH_GND3 can be configured to provide additional isolation between the input (P1) and output (P2) ports, but generally do not need to be configured to provide termination.

In FIG. 5A, the input-side termination circuit 210 has one RC path with C1 and R10 that couples the input port P1 to the shunt ground SH_GND1 via an inductance (L) that can be provided by, for example, a wirebond between R10 and SH_GND1. The output-side termination circuit 220 also has one RC path with C4 and R11 that couples the output port P2 to the shunt ground SH_GND4 via an inductance (L) that can be provided by, for example, a wirebond between R11 and SH_GND4.

In FIG. 5B, the input-side termination circuit 310 has an assembly of three parallel RC paths (C22, C21 and R21 for first path; C20 and R20 for second path; and C1' and R10' for third path) that couples the input port P1 to the shunt ground SH_GND1 via an inductance (L) that can be provided by, for example, a wirebond between node 312 and SH_GND1. The output-side termination circuit 320 also has an assembly of three parallel RC paths (C4' and R11' for first path; C30 and R30 for second path; and C32, C31 and R31 for third path) that couples the output port P2 to the shunt ground SH_GND4 via an inductance (L) that can be provided by, for example, a wirebond between node 322 and SH_GND4.

Example values of the various circuit elements shown in FIGS. 5A and 5B are listed in Table 3.

TABLE 3

| Circuit element | Approximate value |
|---|---|
| R1, R2, R3, R4 | 5,000 ohm |
| R5, R7, R8 | 5,000 ohm |
| R6, R9 | 10,000 ohm |
| R10, R11 | 38 ohm |
| R10', R11' | 80 ohm |
| R20, R30 | 85 ohm |
| R21, R31 | 47 ohm |
| C2, C3 | 2 pF |
| C1, C4 | 15 pF |
| C1', C4' | 15 pF |
| C20, C30 | 8 pF |
| C21, C22, C31, C32 | 1 pF |
| L | 1.0 nH |

FIGS. 6-11 show comparisons of example performance parameters between the absorptive RF switches 200, 300 of FIGS. 5A and 5B. As described herein, it will be apparent that the termination circuits 310 and 320 of FIG. 5B can provide desired enhancement in frequency range in which desired termination impedance is maintained. Further, such an enhancement can be achieved without degrading other performance parameters.

Figure 6A:
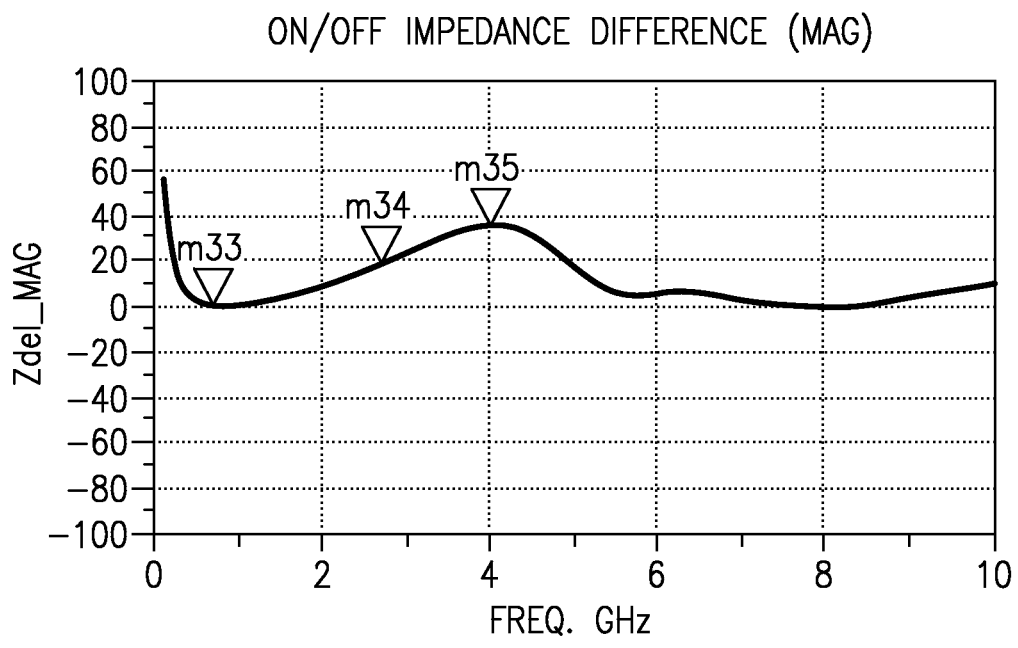
FIGS. 6A and 6B show plots of magnitude of on/off impedance difference corresponding to the example switch configurations of FIGS. 5A and 5B, respectively.
Figure 6B:
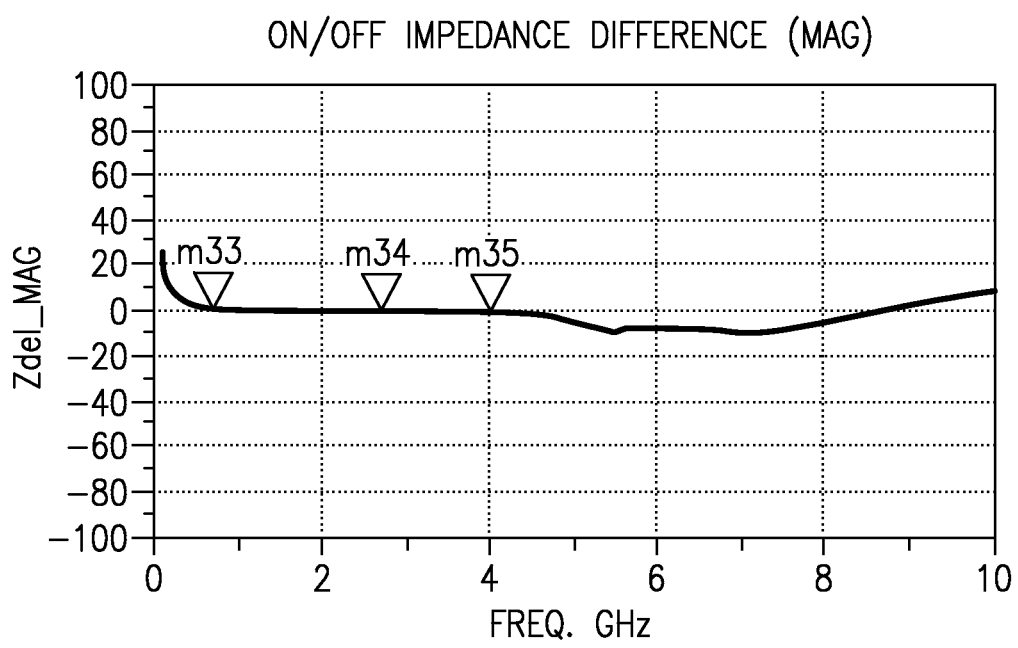

FIGS. 6A and 6B show plots of magnitude of on/off impedance difference corresponding to the example switches 200 and 300 of FIGS. 5A and 5B, respectively. In some implementations, it can be desirable to have a given switch's impedance appear substantially the same to an RF signal when the switch is in both ON and OFF states. For the example switch 200 of FIG. 5A, such is not the case, since the on/off impedance difference is shown to increase significantly at points indicated by "m34" and "m35" (FIG. 6A and Table 4A). In contrast, the example switch 300 of FIG. 5B yields substantially same impedance difference for an extended frequency range that includes points "m33," "m34" and "m35" (FIG. 6B and Table 4B).

TABLE 4A

| Data point | Approximate frequency | Approximate on/off impedance difference |
|---|---|---|
| m33 | 0.7 GHz | 0.434 ohm |
| m34 | 2.7 GHz | 19.255 ohm |
| m35 | 4.0 GHz | 36.846 ohm |

TABLE 4B

| Data point | Approximate frequency | Approximate on/off impedance difference |
|---|---|---|
| m33 | 0.7 GHz | 2.010 ohm |
| m34 | 2.7 GHz | 0.481 ohm |
| m35 | 4.0 GHz | 0.194 ohm |

Figure 7A:
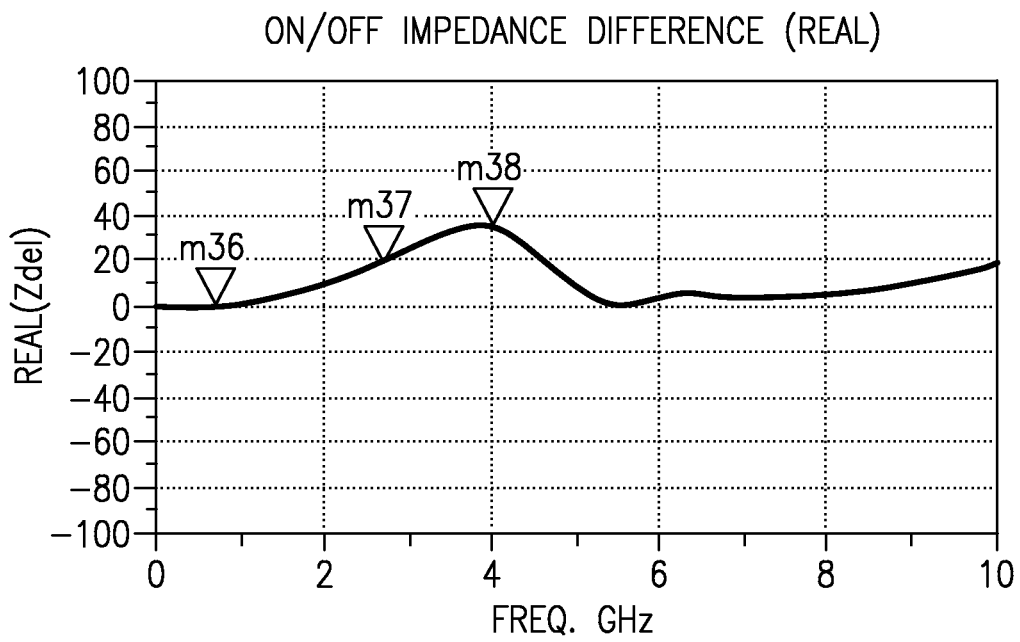
FIGS. 7A and 7B show plots of real portion of on/off impedance difference corresponding to the example switch configurations of FIGS. 5A and 5B, respectively.
Figure 7B:
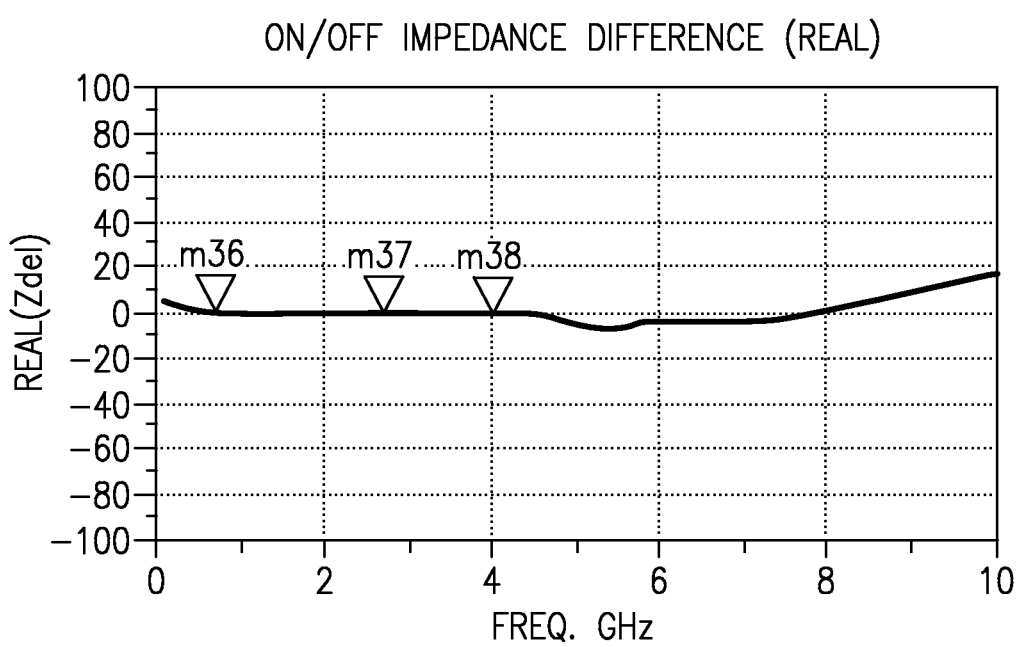

FIGS. 7A and 7B show plots of real portion of on/off impedance difference corresponding to the example switches 200 and 300 of FIGS. 5A and 5B, respectively. Similar to the example of FIG. 6A, the example switch 200 does not yield a desirably uniform on/off difference in a frequency range that includes data points "m36," "m37" and "m38" (Table 5A). In contrast, the example switch 300 yields substantially same impedance difference (real portion) for an extended frequency range that includes points "m36," "m37" and "m38" (Table 5B).

TABLE 5A

| Data point | Approximate frequency | Approximate on/off impedance difference |
|---|---|---|
| m33 | 0.7 GHz | 0.572 ohm |
| m34 | 2.7 GHz | 20.275 ohm |
| m35 | 4.0 GHz | 36.188 ohm |

TABLE 5B

| Data point | Approximate frequency | Approximate on/off impedance difference |
|---|---|---|
| m33 | 0.7 GHz | 0.784 ohm |
| m34 | 2.7 GHz | 0.271 ohm |
| m35 | 4.0 GHz | 0.617 ohm |

Figure 8A:
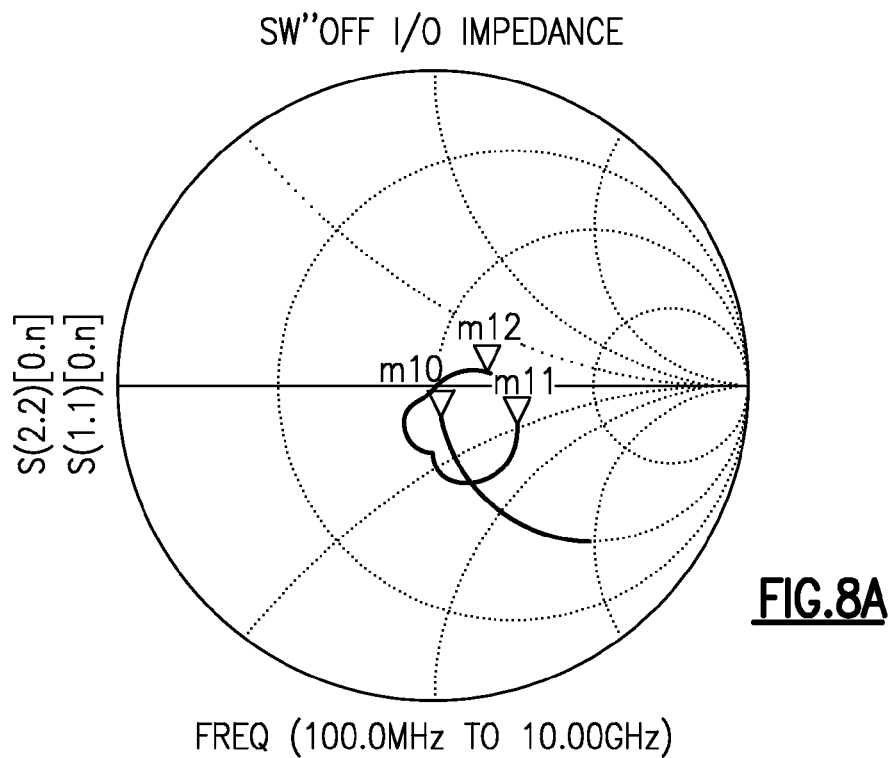
FIGS. 8A and 8B show Smith charts corresponding to off states of the example switch configurations of FIGS. 5A and 5B, respectively.
Figure 8B:
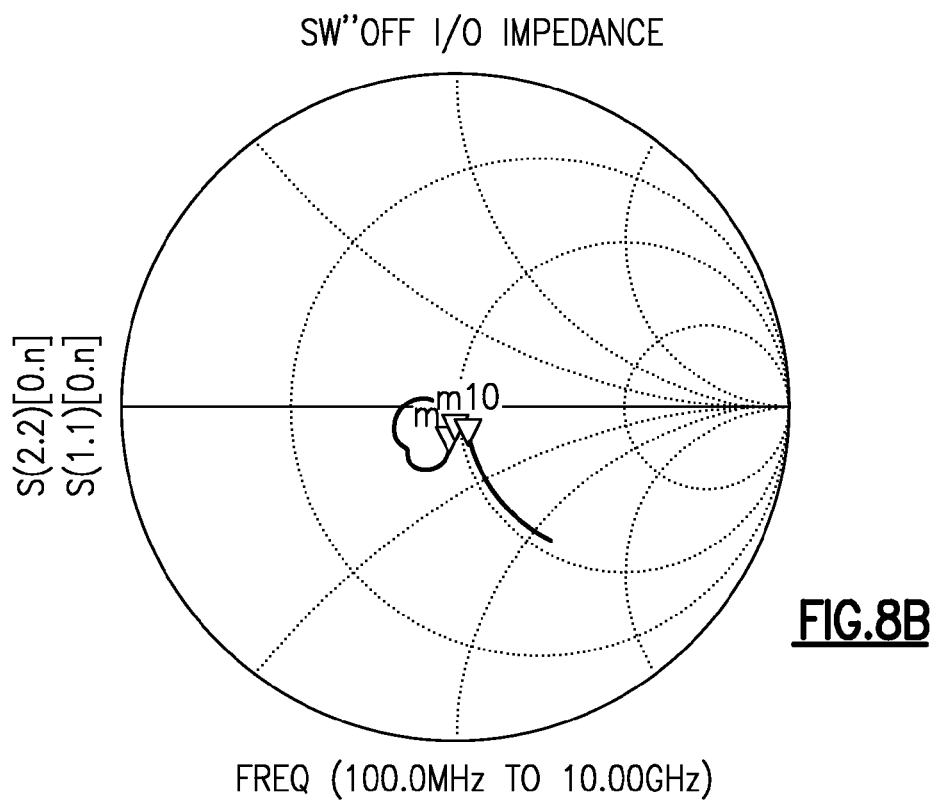

FIGS. 8A and 8B show Smith charts corresponding to OFF states of the example switches 200 and 300 of FIGS. 5A and 5B, respectively. Unlike the examples described in reference to FIGS. 6 and 7, the comparison here is specifically for the OFF state, during which desired termination impedance is sometimes desirable. As shown in FIG. 8A, the example switch 200 yields complex impedance values that deviate significantly from a desired impedance of about 50+j0 ohm in a frequency range that includes data points "m10," "m11" and "m12" (Table 6A). In contrast, the example switch 300 yields complex impedance values that deviate significantly less (compared to that of the example switch 200) from the desired impedance of about 50+j0 ohm in an extended frequency range that includes points "m10," "m11" and "m12" (Table 6B).

TABLE 6A

| Data point | Approximate frequency | Approximate complex impedance (OFF) |
|---|---|---|
| m10 | 0.7 GHz | 50.665 − j10.558 ohm |
| m11 | 2.7 GHz | 82.283 − j22.589 ohm |
| m12 | 4.0 GHz | 69.164 + j4.344 ohm |

TABLE 6B

| Data point | Approximate frequency | Approximate complex impedance (OFF) |
|---|---|---|
| m10 | 0.7 GHz | 51.834 − j11.743 ohm |
| m11 | 2.7 GHz | 46.308 − j12.653 ohm |
| m12 | 4.0 GHz | 48.314 − j9.944 ohm |

Figure 9A:
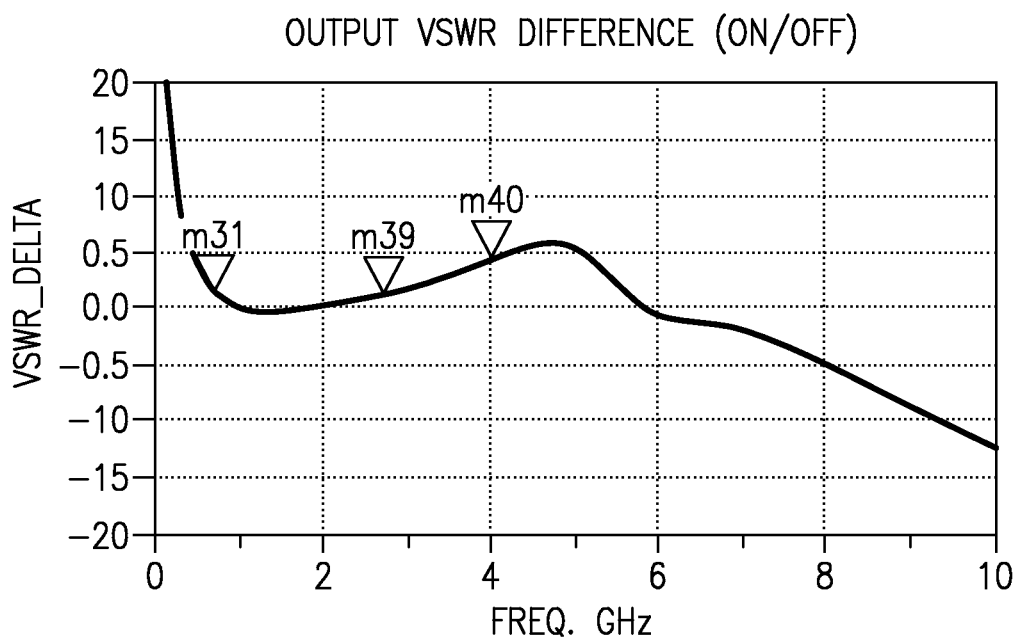
FIGS. 9A and 9B show plots of output VSWR (voltage standing wave ratio) difference between on and off states corresponding to the example switch configurations of FIGS. 5A and 5B, respectively.
Figure 9B:
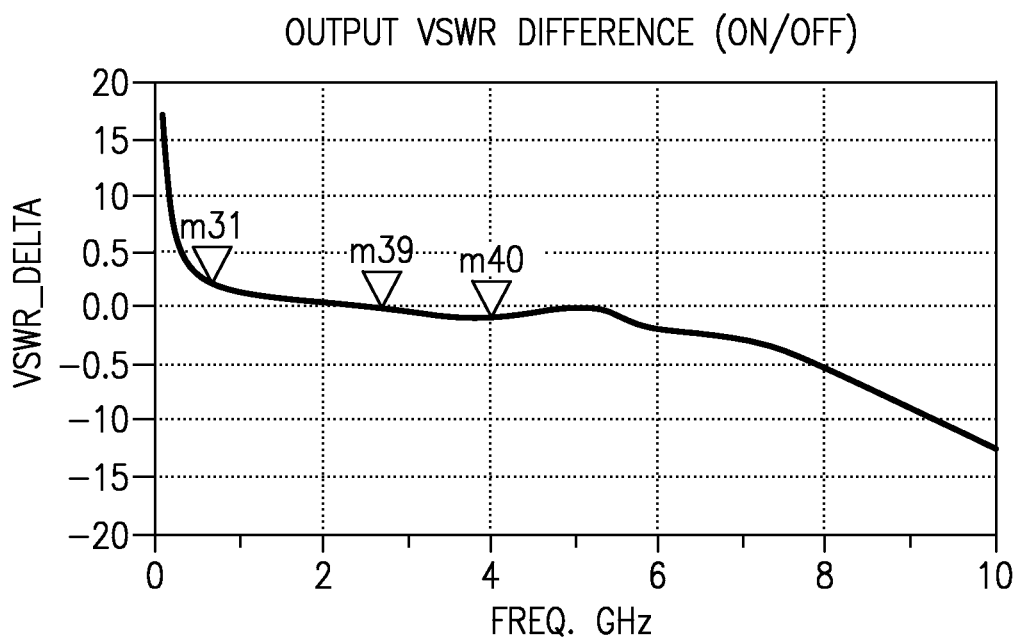

FIGS. 9A and 9B show plots of output VSWR (voltage standing wave ratio) difference between on and off states corresponding to the example switches 200 and 300 of FIGS. 5A and 5B, respectively. As shown, the example switch 200 does not yield a desirably uniform on/off difference in output VSWR in a frequency range that includes data points "m31,"

"m39" and "m40" (Table 7A). In contrast, the example switch 300 yields significantly more uniform on/off difference in output VSWR for an extended frequency range that includes points "m31," "m39" and "m40" (Table 7B).

TABLE 7A

| Data point | Approximate frequency | Approximate on/off difference in VSWR |
|---|---|---|
| m31 | 0.7 GHz | 0.169 |
| m39 | 2.7 GHz | 0.152 |
| m40 | 4.0 GHz | 0.452 |

TABLE 7B

| Data point | Approximate frequency | Approximate on/off difference in VSWR |
|---|---|---|
| m31 | 0.7 GHz | 0.198 |
| m39 | 2.7 GHz | 0.024 |
| m40 | 4.0 GHz | 0.080 |

Figure 10A:
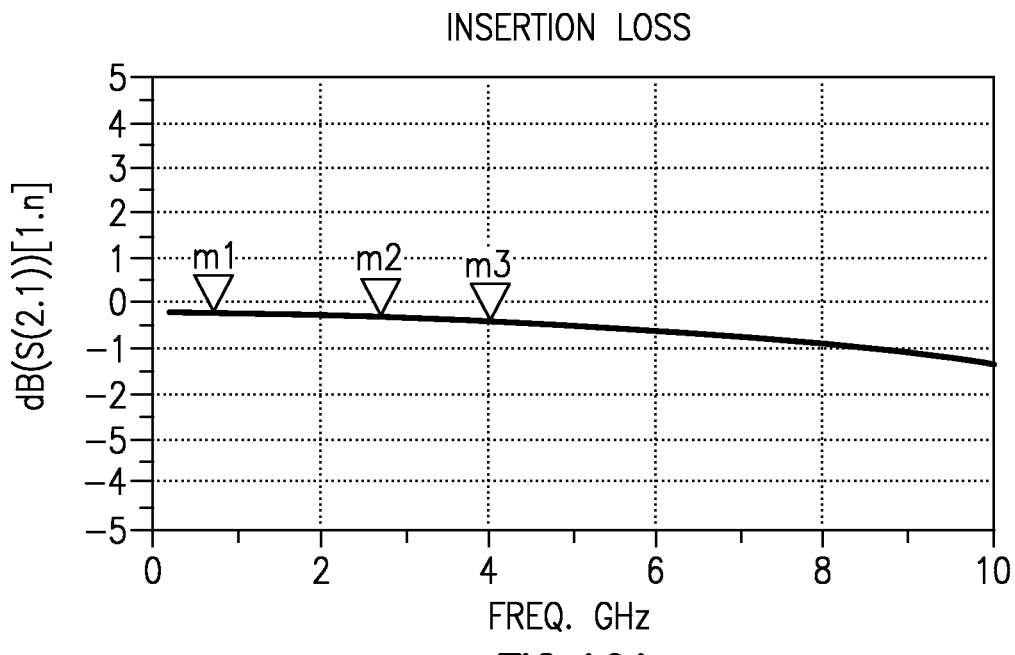
FIGS. 10A and 10B show plots of insertion loss difference between on and off states corresponding to the example switch configurations of FIGS. 5A and 5B, respectively.
Figure 10B:
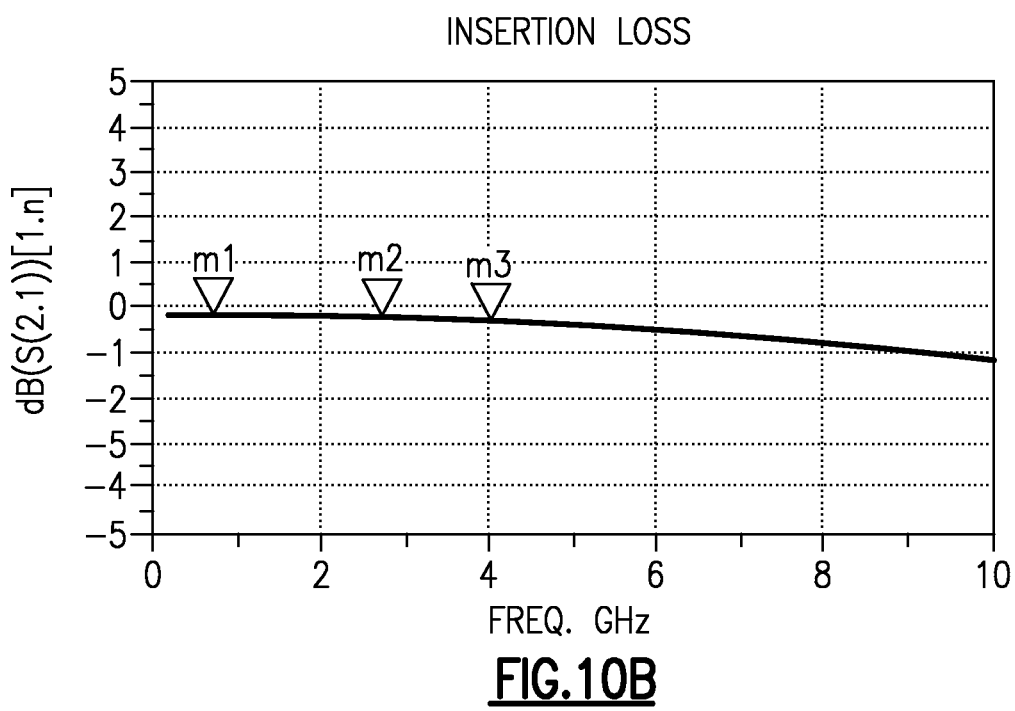

In some implementations, the foregoing examples of advantageous extension of operating frequency bandwidth can be achieved without sacrificing other performance features. For example, FIGS. 10A and 10B show plots of switch on-state insertion loss corresponding to the example switches 200 and 300 of FIGS. 5A and 5B, respectively. As shown, the example switch 200 yields an insertion loss in a frequency range that includes data points "m1," "m2" and "m3" (Table 8A). The example switch 300 also yields a similar insertion loss response a frequency range that includes points "m1," "m2" and "m3" (Table 8B).

TABLE 8A

| Data point | Approximate frequency | Approximate on-state insertion loss |
|---|---|---|
| m1 | 0.7 GHz | −0.202 dB |
| m2 | 2.7 GHz | −0.264 dB |
| m3 | 4.0 GHz | −0.344 dB |

TABLE 8B

| Data point | Approximate frequency | Approximate on-state insertion loss |
|---|---|---|
| m1 | 0.7 GHz | −0.187 dB |
| m2 | 2.7 GHz | −0.254 dB |
| m3 | 4.0 GHz | −0.337 dB |

Figure 11A:
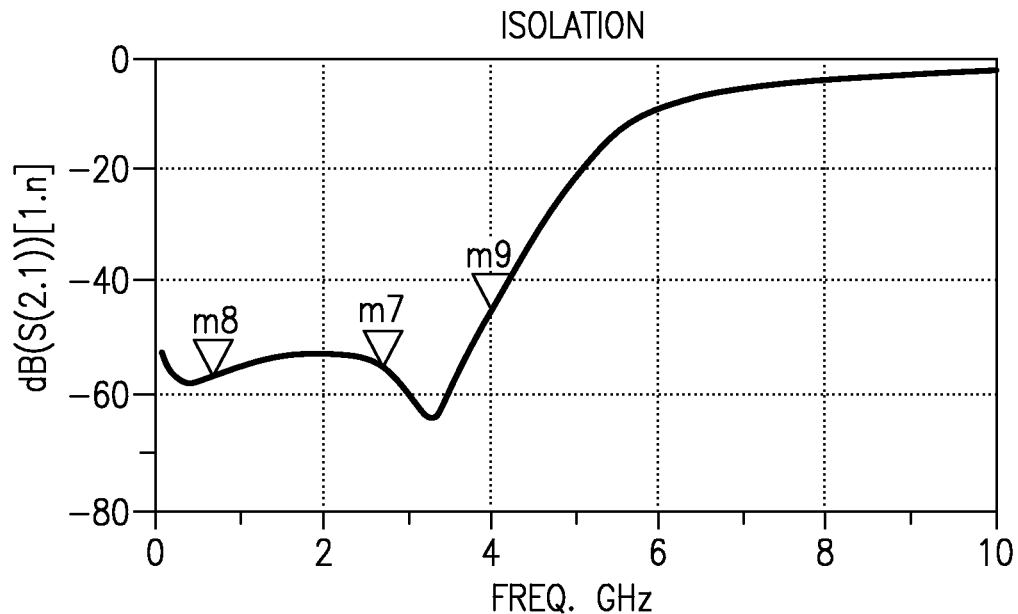
FIGS. 11A and 11B show plots of isolation difference between on and off states corresponding to the example switch configurations of FIGS. 5A and 5B, respectively.
Figure 11B:
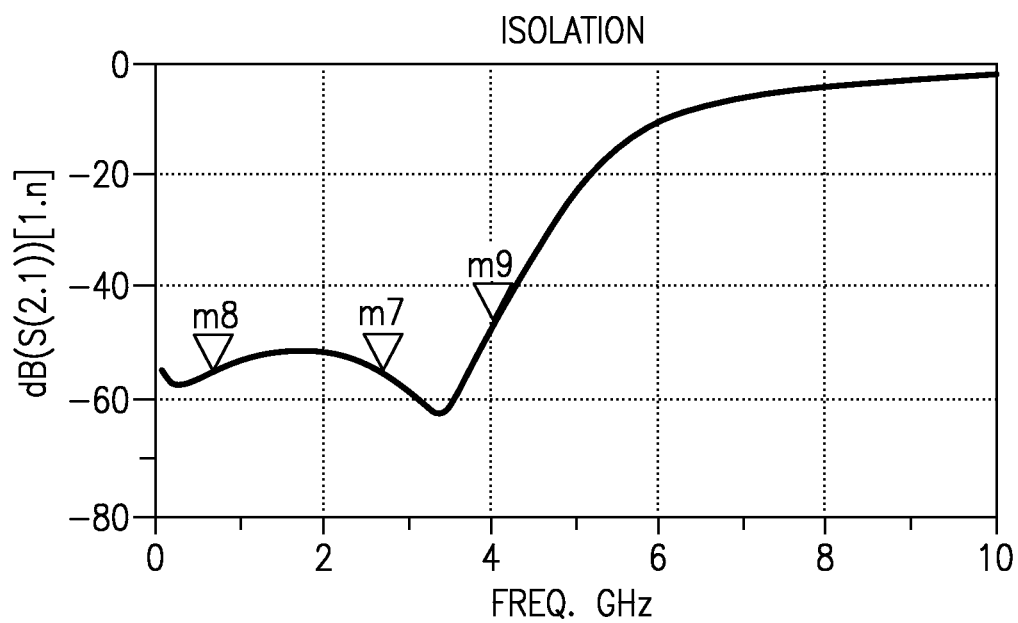

In another example, FIGS. 11A and 11B show plots of switch isolation corresponding to the example switches 200 and 300 of FIGS. 5A and 5B, respectively. As shown, the example switch 200 yields an off-state isolation in a frequency range that includes data points "m8," "m7" and "m9" (Table 9A). The example switch 300 also yields a similar isolation response a frequency range that includes points "m8," "m7" and "m9" (Table 9B).

TABLE 9A

| Data point | Approximate frequency | Approximate insertion loss |
|---|---|---|
| m8 | 0.7 GHz | −56.534 dB |
| m7 | 2.7 GHz | −54.986 dB |
| m9 | 4.0 GHz | −44.517 dB |

TABLE 9B

| Data point | Approximate frequency | Approximate insertion loss |
|---|---|---|
| m8 | 0.7 GHz | −54.726 dB |
| m7 | 2.7 GHz | −54.994 dB |
| m9 | 4.0 GHz | −46.041 dB |

As described herein, the foregoing performance enhancement examples can be achieved by a termination circuit having two or more RC branches electrically connected in parallel. It will be understood that for the purpose of description herein, an RC branch can include one or more resistors connected in series, in parallel, or any combination thereof so as to yield a desired resistance for the RC branch. The RC branch can also include one or more capacitors connected in series, in parallel, or any combination thereof so as to yield a desired capacitance for the RC branch. It will also be understood that resistors and capacitors described herein can be discrete components, be formed as parts of an integrated circuit, or any combination thereof.

In embodiments where inductance for a termination circuit is provided by a grounding bond wire, the effective capacitance for the termination circuit can be tuned to resonate with the ground bond wire inductance within a desired frequency range. Further, individual resistance values of resistors in the termination circuit can be selected so that the net resistance is substantially maintained at a desired value (such as about 50 ohms) within the frequency range. As described herein, such a configuration of RC branches can yield the desired frequency range of operation with little or no impact on switch isolation and/or insertion loss.

In some implementations, the foregoing desired frequency range can be selected based on a specified need of a switching device. For example, it may be desirable to design an absorptive RF switch (such as a single-pole, single-throw absorptive switch) with input and/or output termination impedance in the "OFF" state that is within a selected tolerance (such as within about 1 ohm) of the "ON" state impedance, across a desired frequency range (such as about 0.500 GHz to 4 GHz). Other tolerance values as well as desired frequency ranges above and/or below the foregoing example are also possible. For example, an absorptive RF switch having one or more features as described herein can be configured to provide desirable termination impedance for a higher frequency range of about 2.5 GHz to 6.0 GHz.

Figure 12:
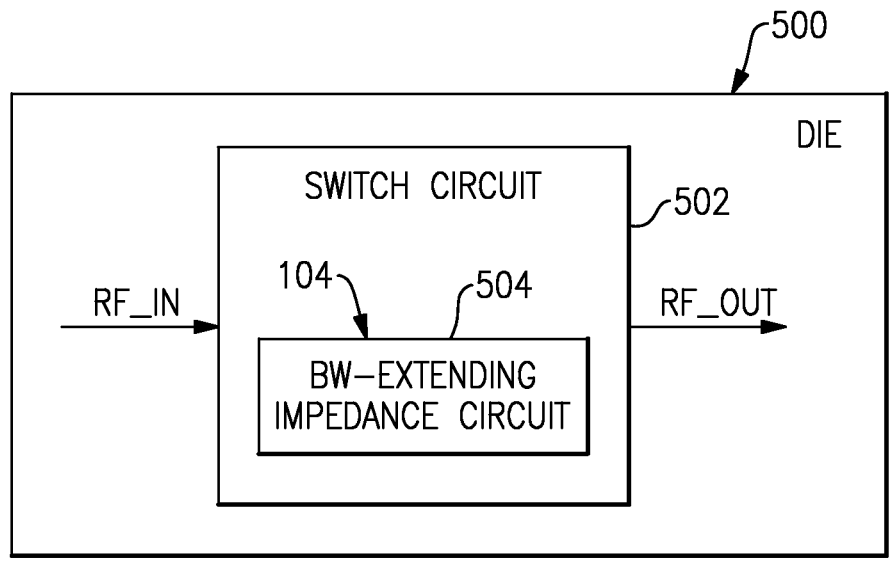
FIG. 12 shows that in some implementations, a bandwidth-extending impedance circuit having one or more features as described herein can be part of a switch circuit formed on a die.

FIG. 12 shows that in some embodiments, one or more features associated with the bandwidth-extending impedance circuit (e.g., 104 in FIGS. 1, 2, 4A, 5B) can be implemented as a circuit 504 that is part of a switch circuit 502. Such a switch circuit 502 can be implemented on a die 500 so as to allow switching ON of the switch circuit to pass an input RF signal (RF_IN) as an output RF signal (RF_OUT). The switch circuit 504 can also be switched OFF; and in such a state, one or more of the bandwidth-extending impedance circuit 504 coupled to the input and/or output can provide desired impedance for an extended frequency range.

Figure 13:
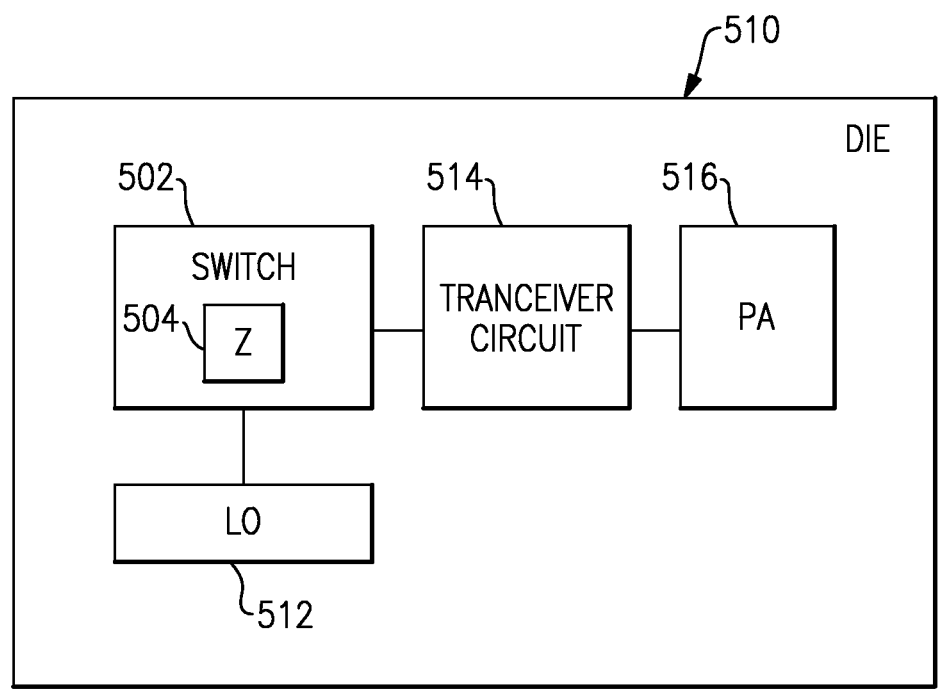
FIG. 13 shows that in some implementations, the example die of FIG. 12 can include other components configured to process RF signals.

FIG. 13 shows an example of an RF application where the switch circuit of FIG. 12 can be implemented. A die 510 having a number of functional circuits can be provided. For example, a transceiver circuit 514 can receive signals from a local oscillator (LO) 512 via a switch circuit 502 so as to process RF signals provided to or received from a power amplifier 516. The switch circuit 502 can include one or more bandwidth-extending impedance circuits 504 having one or more features as described herein. Desirability of such a switch circuit 502 is described herein in greater detail.

Figure 14:
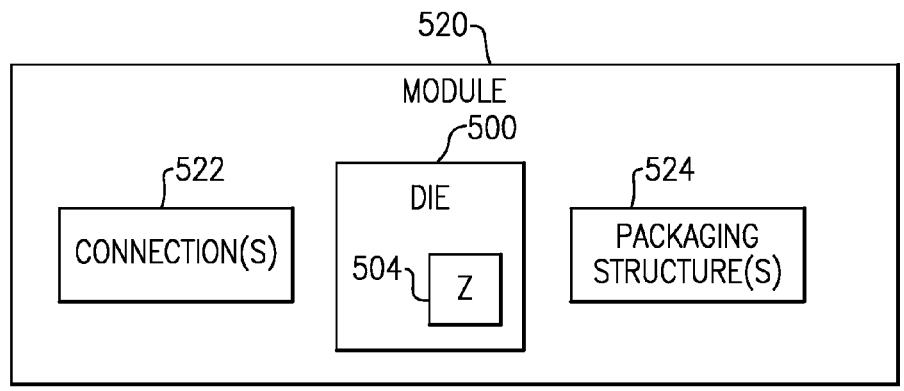
FIG. 14 shows that in some implementations, the example die of FIG. 12 can be part of a packaged module.

FIG. 14 schematically shows that in some embodiments, a die (such as the example die 500 of FIG. 12) can be implemented in a packaged module 520. The die 500 can include a bandwidth-extending impedance circuit 504 having one or more features as described herein. Such a module can further include one or more connections 522 configured to facilitate passage of signals and/or power to and from the die 500. Such a module can further include one or more packaging structures 524 that provide functionality such as protection (e.g., physical, electromagnetic shielding, etc.) for the die 500. In some embodiments, the connections 522 can include conductive paths such as bond wires to accommodate wirebond-implementation modules, and/or conductive traces to accommodate flipchip-implementation modules.

Figure 15A:
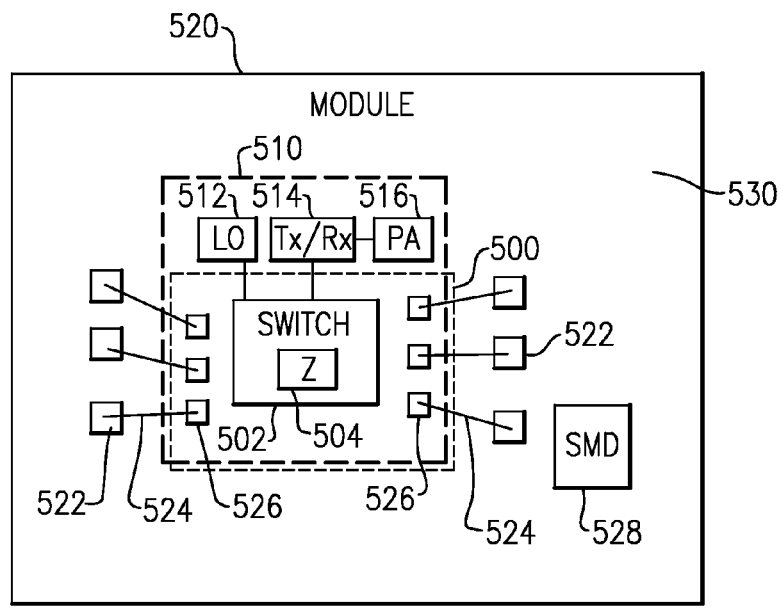
FIGS. 15A and 15B show a more specific example of the packaged module of FIG. 14.

In the context of the example RF application described in reference to FIG. 13, an example package module 520 is depicted in FIGS. 15A (plan view) and 15B (side view). Depending on how a die is implemented, the example module 520 can include a die 500 (e.g., similar to the example of FIG. 12) or a die 510 (e.g., similar to the example of FIG. 13). Such a die can be fabricated using a number of semiconductor process technologies. The die (500 or 510) can include a plurality of electrical contact pads 526 configured to allow formation of electrical connections 524 such as wirebonds between the die (500 or 510) and contact pads 522 formed on a packaging substrate 530 of the module 520.

The packaging substrate 530 can be configured to receive a plurality of components such as the die (500 or 510) and one or more surface-mounted devices SMDs (e.g., 528). In some embodiments, the packaging substrate 530 can include a laminate substrate.

The module 520 is shown to include a switch 502 with a bandwidth-extending impedance circuits 504 having one or more features as described herein. As described herein, such a switch can provide switching functionality between a local oscillator (LO) 512 and a transceiver circuit 514 so as to process RF signals provided to or received from a power amplifier 516.

The module 520 is shown to include a plurality of mounting contact pads 534, 536 disposed on the side opposite from the side where the die (500 or 510) is mounted on. The module 520 is shown to further include various interconnects 532 that can be configured to provide electrical connections between, for example, the die-side contact pads (522), SMD(s) (528) and the mounting contact pads (534, 536). Such a configuration can allow easy mounting of the module 520 on a circuit board such as a phone board of a wireless device. The example contact pads 536 can be configured to provide a ground connection. The example contact pads 534 can be configured to provide connections for power and RF signals.

In some embodiments, the module 520 can also include one or more packaging structures to, for example, provide protection and facilitate easier handling of the module 520. Such a packaging structure can include an overmold 540 formed over the packaging substrate 530 and dimensioned to substantially encapsulate the various circuits thereon.

It will be understood that although the module 520 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a handheld wireless device with or without phone functionality, a wireless tablet, etc.

Figure 15B:
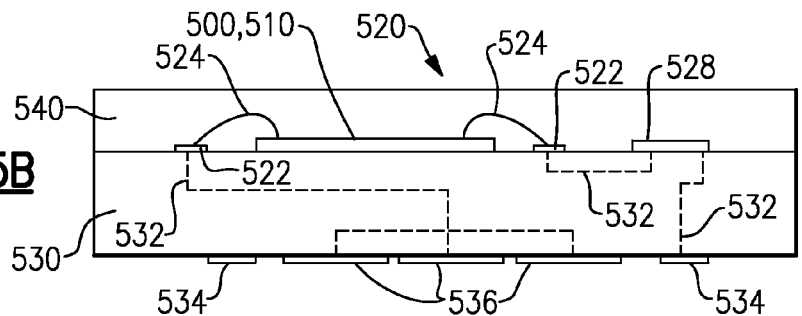
Figure 16:
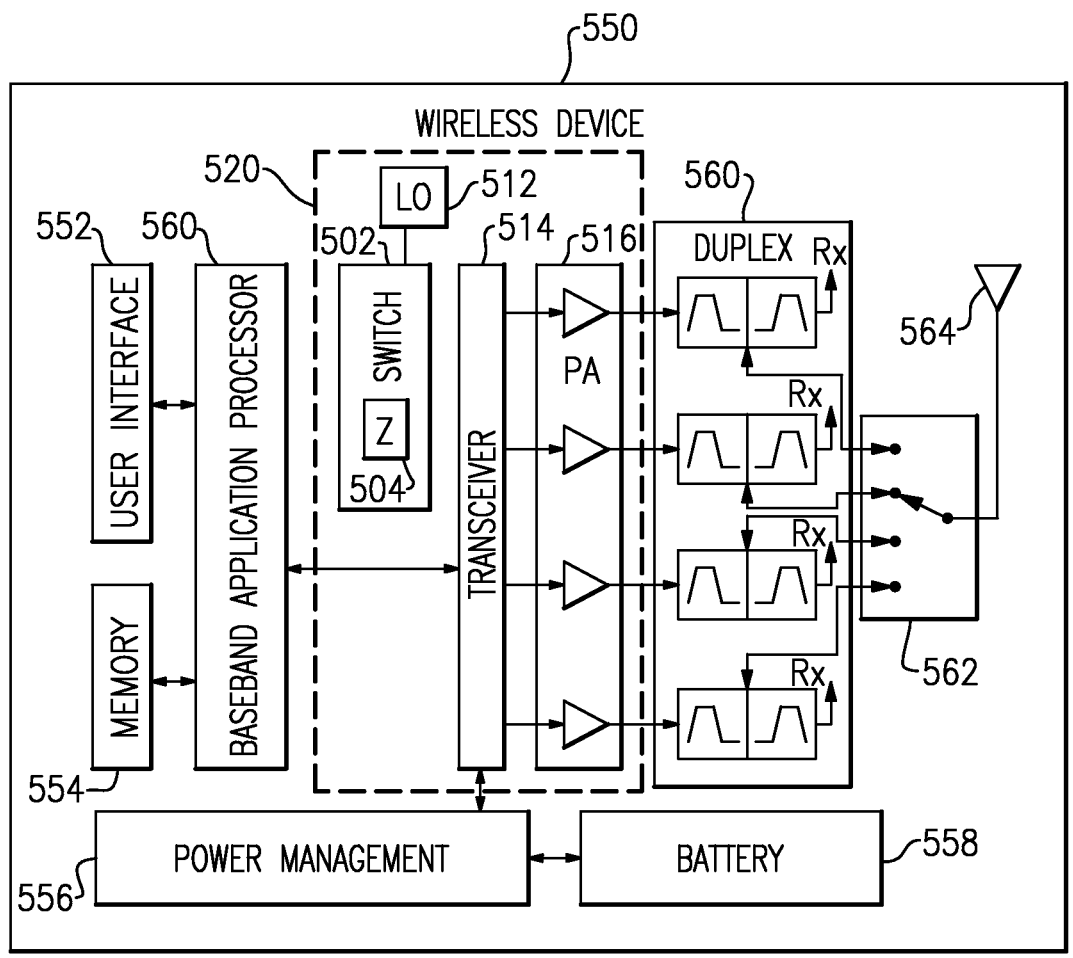
FIG. 16 shows that in some implementations, one or more features associated with the example dies and/or modules of FIGS. 12-15 can be part of a wireless device.

FIG. 16 schematically depicts an example wireless device 550 having one or more advantageous features described herein. In the context of a bandwidth-extending impedance circuit for a switch utilized in the example manner as described in reference to FIG. 15, a switch 502 is shown to be connected to a local oscillator (LO) 512 and a transceiver 514 to facilitate RF operation of the wireless device 550. The transceiver 514 is shown to provide RF signals (e.g., signals associated with different bands and/or different modes) to a power amplifier (PA) 516 for amplification. In embodiments where the PA 516, transceiver 514, switch 502 and the LO 512 are packaged into a module, such a module can be represented by a dashed box 520.

The transceiver 514 is shown to interact with a baseband application processor 560 that is configured to provide conversion between data and/or voice signals suitable for a user and RF signals suitable for the transceiver 514. The transceiver 514 is also shown to be connected to a power management component 556 that is configured to manage power for the operation of the wireless device, utilizing power from a source such as a battery 558. Such power management can also control operations of other components of the wireless device 550.

The baseband application processor 560 is shown to be connected to a user interface 552 to facilitate various input and output of voice and/or data provided to and received from the user. The baseband application processor 560 can also be connected to a memory 554 that is configured to store data and/or instructions to facilitate the operation of the wireless device, and/or to provide storage of information for the user.

In the example wireless device 550, outputs of the power amplifier 516 are shown to be routed to an antenna 564 via their respective duplexers of a duplex component 560 and a band-selection switch 562. The band-selection switch 562 can include, for example, a single-pole-multiple-throw (e.g., SP4T) switch to allow selection of an operating band (e.g., Band 2). In some embodiments, each duplexer can allow transmit and receive operations to be performed simultaneously using a common antenna (e.g., 564). In FIG. 16, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Figure 17:
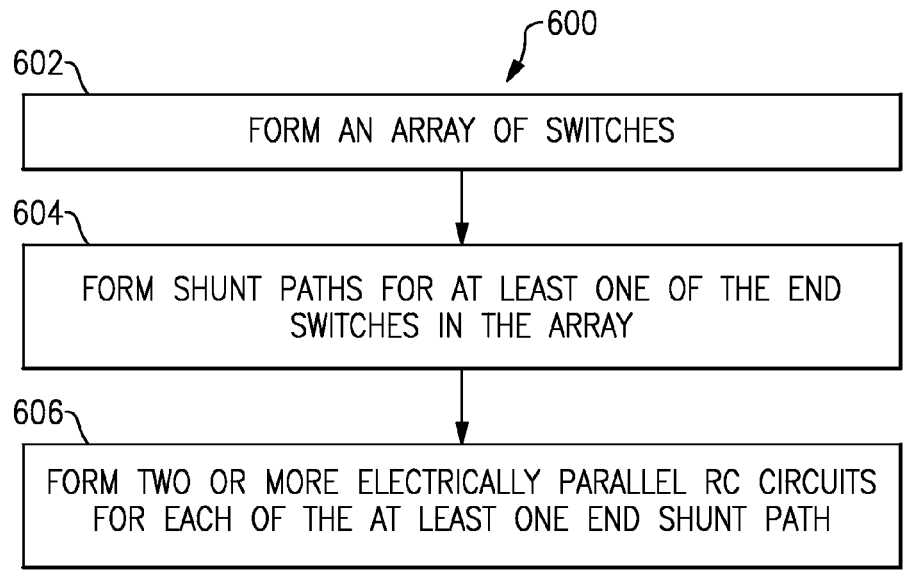
FIG. 17 shows a process that can be implemented to fabricate an absorptive RF switch having one or more features as described herein.

FIG. 17 shows a process 600 that can be implemented to fabricate a bandwidth-extending impedance circuit 504 having one or more features as described herein. In block 602, an array of switches can be formed. In the context where such switches are formed on a semiconductor substrate, semiconductor switches such as FETs can be formed on the substrate. In block 604, shunt paths for at least one of the end switches in the array can be formed. Such shunt paths can be controlled, for example, in a manner similar to that described herein in reference to FIGS. 5A and 5B. In the semiconductor substrate context, such shunt paths can include semiconductor devices such as FETs, resistors and capacitors formed on the substrate and/or implemented as discrete components. In some implementations, inductance associated with such shunt paths can be provided by grounding bond wires that couple the shunt paths to a signal ground. In block 606, at least one of the end shunt paths associated with the input and output can be formed so as to include two or more electrically parallel RC branches. Values of resistors and capacitors can be selected as described herein so as to achieve the bandwidth-extending impedance functionality.

Figure 18:
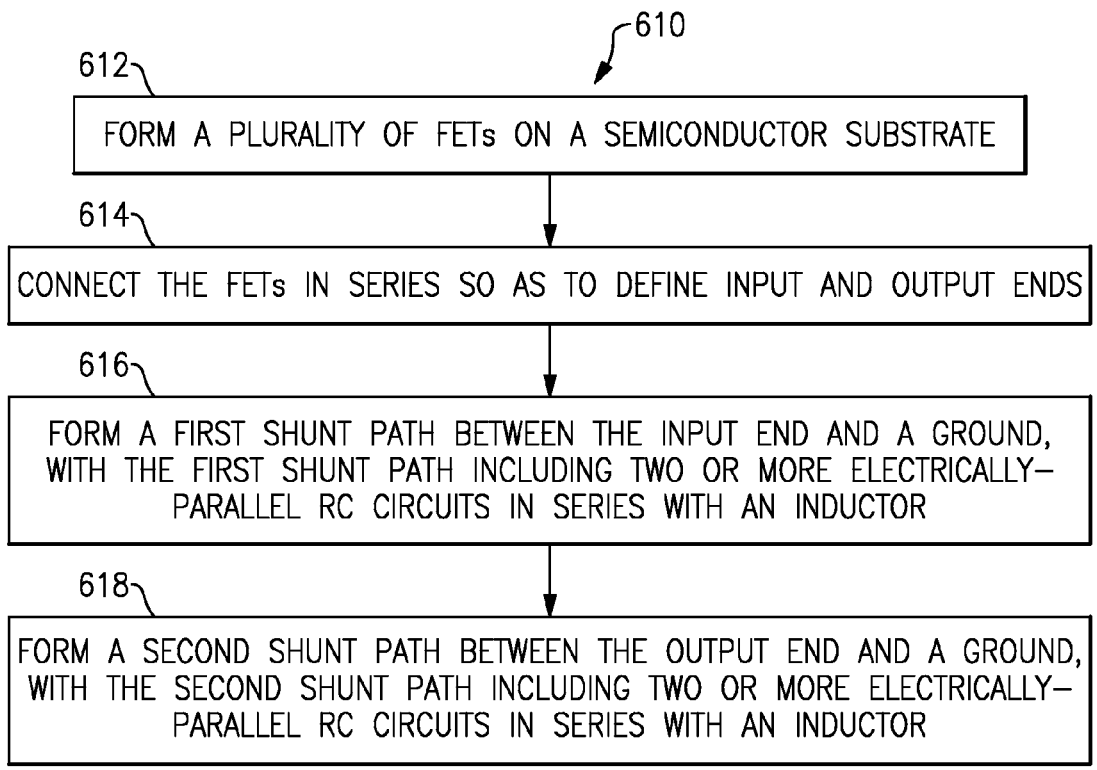
FIG. 18 shows a process that can be implemented as a more specific example of the process of FIG. 17.

FIG. 18 shows a process 610 that can be a more specific example of the process 600 of FIG. 17. In block 612, a plurality of FETs can be formed on a semiconductor substrate. In block 614, the FETs can be connected in series so as to define an input end and an output end. In block 616, a first shunt path can be formed between the input end and a signal ground. The first shunt path can include an assembly of two or more electrically parallel RC branches, and such an assembly can be formed so as to be in series with an inductor between the input and the signal ground. In block 618, a second shunt path can be formed between the output end and the signal ground. The second shunt path can include an assembly of two or more electrically parallel RC branches, and such an assembly can be formed so as to be in series with an inductor between the output and the signal ground.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A switching circuit, comprising:
an input port configured to receive a radio-frequency (RF) signal;
an output port;
a switch configured to be capable of being in an ON state in which the switch passes the RF signal from the input port to the output port, and an OFF state in which the switch does not pass the RF signal; and
a termination circuit configured to provide desired impedance for the input port or the output port, the termination circuit including an assembly including a resistor in electrical series with a capacitor, and an inductor in electrical series with the assembly, an effective capacitance of the termination circuit and an inductance of the inductor being selected such that the effective capacitance of the termination circuit resonates with an inductance of the termination circuit.

2. The switching circuit of claim 1 wherein the termination circuit is connected to the input port or the output port.

3. The switching circuit of claim 1 wherein the termination circuit is connected to the input port, the switching circuit further comprising a second termination circuit connected to the output port.

4. The switching circuit of claim 1 wherein the assembly includes a plurality of electrically parallel branches, each of the electrically parallel branches including at least one capacitor in electrical series with at least one resistor.

5. The switching circuit of claim 1 wherein the effective capacitance of the termination circuit and the inductance of the termination circuit are selected such that the effective capacitance resonates with the inductance within a frequency range of 0.500 GHz to 4 GHz.

6. The switching circuit of claim 1 wherein the desired impedance includes a value of 50 ohm.

7. The switching circuit of claim 1 wherein the termination circuit is configured to provide the desired impedance when the switch in the OFF state.

8. A semiconductor die having an integrated circuit (IC), the die comprising:
a substrate configured to receive a plurality of components;
a switching circuit disposed on the substrate, the switching circuit having an input and an output, and configured to be capable of being in an ON state in which the switching circuit passes an RF signal from the input to the output, and an OFF state in which the switching circuit does not pass the RF signal; and
a termination circuit coupled to the input or output of the switching circuit and configured to provide a desired termination impedance for the switching circuit, the termination circuit including an assembly having at least one resistor-capacitor (RC) branch, the assembly being configured to be connected in electrical series with an inductor, an effective capacitance of the termination circuit and an inductance of the inductor being selected such that the effective capacitance of the termination circuit resonates with the inductance of the termination circuit.

9. The semiconductor die of claim 8 wherein the switching circuit includes a switching circuit for an absorptive switch.

10. The semiconductor die of claim 8 further comprising a plurality of electrical contact pads configured to allow formation of electrical connections between the die and corresponding contact pads formed on a packaging substrate.

11. The semiconductor die of claim 8 further comprising a transceiver circuit and a local oscillator (LO), the switching circuit being configured to pass signals from the local oscillator to the transceiver.

12. A wireless device, comprising:
an antenna;
a transceiver coupled to the antenna and configured to process radio-frequency (RF) signals; and
an RF switch coupled to the transceiver and configured to be capable of being in an ON state in which the RF switch passes an RF signal from an input of the RF switch to an output of the RF switch, and an OFF state in which the RF switch does not pass the RF signal, the RF switch including at least one termination circuit configured to provide a desired termination impedance for the RF switch, the termination circuit including an assembly having at least one resistor-capacitor (RC) branch and the assembly being in electrical series with an inductor, an effective capacitance of the termination circuit and an inductance of the inductor being selected such that the effective capacitance of the termination circuit resonates with the inductance of the termination circuit.

13. The wireless device of claim 12 further comprising a local oscillator (LO) and a power amplifier, the switching circuit being configured to provide switching functionality between the local oscillator and the transceiver circuit, the transceiver circuit being configured to provide RF signals to the power amplifier, and RF signals output from the power amplifier being routed to the antenna.

14. The wireless device of claim 13 wherein the RF switch, local oscillator, transceiver and power amplifier are on a semiconductor die.

15. The wireless device of claim 12 further comprising a power management component configured to manage power for operating the wireless device.

16. The wireless device of claim 15 wherein the power management component is configured to manage power for operating the wireless device utilizing power from a battery.

17. The wireless device of claim 12 further comprising a packaged module including a packaging substrate to receive a plurality of components, the packaged module including an integrated circuit (IC) formed on a semiconductor die, the semiconductor die being mounted on the packaging substrate, and the IC including the RF switch.

18. The wireless device of claim 17, wherein the packaged module includes conductive paths to pass signals to and from the packaged module, the conductive paths including conductive traces or bond wires.

19. The wireless device of claim 17, wherein the packaged module includes a packaging structure configured to provide protection for the packaged module.

20. The wireless device of claim 17 wherein the packaged module includes an overmold formed over the packaging substrate and dimensioned to substantially encapsulate the plurality of components.

* * * * *